(12) United States Patent
Truyens

(10) Patent No.: US 7,222,720 B2
(45) Date of Patent: May 29, 2007

(54) DEVICE FOR TRANSFERRING ELECTRONIC COMPONENTS FROM AN INCLINED SUPPLY TRACK TO ANOTHER ELEMENT

(75) Inventor: Carl Truyens, Rotselaar (BE)

(73) Assignee: Icos Vision Systems, naamloze vennootschap, Heverlee (BE)

( * ) Notice: Subject to any disclaimer, the term of this patent is extended or adjusted under 35 U.S.C. 154(b) by 256 days.

(21) Appl. No.: 10/508,544

(22) PCT Filed: Jun. 21, 2002

(86) PCT No.: PCT/BE02/00103

§ 371 (c)(1),
(2), (4) Date: Sep. 28, 2004

(87) PCT Pub. No.: WO04/002207

PCT Pub. Date: Dec. 31, 2003

(65) Prior Publication Data

US 2005/0163604 A1 Jul. 28, 2005

(51) Int. Cl.
*B65G 17/46* (2006.01)

(52) U.S. Cl. .................................. 198/471.1; 198/478.1

(58) Field of Classification Search ............. 198/471.1, 198/478.1, 532, 540, 562

See application file for complete search history.

(56) References Cited

U.S. PATENT DOCUMENTS

| 3,563,377 | A | * | 2/1971 | Southcott | 198/471.1 |
| 4,673,077 | A | | 6/1987 | Taniguchi | |
| 4,735,761 | A | * | 4/1988 | Lindenberger | 198/478.1 |
| 5,469,953 | A | * | 11/1995 | Igarashi et al. | 198/471.1 |
| 5,617,945 | A | * | 4/1997 | Takahashi et al. | 198/471.1 |

FOREIGN PATENT DOCUMENTS

WO 01 62596 A 8/2001

* cited by examiner

*Primary Examiner*—James R. Bidwell
(74) *Attorney, Agent, or Firm*—Bacon & Thomas, PLLC

(57) ABSTRACT

Device for transferring electronic components (2) from a inclined gravity supply track (3) to another element, more particularly a receiving element (6), characterised in that it comprises at least one swing arm (14) fixed to an inclined rotating shaft (13) that is connected to driving means (15) and that is positioned between the supply track (3) and the receiving element (6), whereby the swing arm (14) forms an angle (C) with the rotating shaft (13) and is at least rotatable between a first position, whereby it is situated parallel to and above the supply track (3), and a second position whereby the swing arm (14) is situated above the receiving element (6), said device (1) further comprising suction means to suck up and to hold a concerned component (2) against the swing arm (14).

13 Claims, 4 Drawing Sheets

DEVICE FOR TRANSFERRING ELECTRONIC COMPONENTS FROM AN INCLINED SUPPLY TRACK TO ANOTHER ELEMENT

BACKGROUND OF THE INVENTION

A. Field

The present invention concerns a device for transferring electronic components from an inclined supply track to another element like a packing element, a printed circuit board, a testing device or the like.

B. Related Technology

In particular, it concerns a device which can be used in tape-and-reel packaging machines for successively transferring single electronic components like semiconductors, IC's, and such, from an inclined gravity supply track to a packing tape that is provided with pockets to hold single components and which is stepwise moved forward and sealed off, as said electronic components are inserted one by one in said pockets, which packing tape is then wound on a reel.

Such tapes filled with electronic components are efficiently used for automated assembly of printed circuit boards or the like.

In traditional tape-and-reel devices, said electronic components are transferred from the inclined gravity supply track to the tape-and-reel mechanism, mainly by two types of pick-and-place devices.

A first type of known pick-and-place devices is formed by a single swing arm which is equipped with a vacuum nozzle that is pressed on the top of the electronic component to hold it. The electronic component is then lifted from the supply track and moved over a pocket in the tape, following which the component is pushed into the underlying pocket and is released.

A second type of known pick-and-place devices is more complex and is formed by a rotary turret which is equipped with a single vacuum nozzle to pick up the electronic components from the supply track and to move them to subsequent stations for inspection and transfer to a tape.

A disadvantage of these known pick-and-place devices is that the electronic components are subjected to impact forces that can damage the components, especially when new generation components, like for instance fragile thin shrink small components, have to be handled.

In these known pick-and-place devices the components are also exposed to lateral inertia forces that can cause the components to be misaligned on said vacuum nozzle, resulting in an incorrect positioning of the component over a pocket. When the misaligned component is next pushed into the pocket, the fragile leads are usually severely damaged and a useless component is sealed into the tape.

More recently, another kind of device has been introduced to transfer the electronic components from an inclined supply track to a tape. This known device is formed by a rotating disk that is conically shaped, so that at one side the disk is aligned to the supply track and that the opposing side of the disk is in a horizontal position. The electronic components slide from the supply track into radial slots in the edge of the disk and are rotated to the opposite side, where they are picked up by a rotating pick-and-place mechanism to transfer them to a tape.

A disadvantage of this more recently known type of device is that the leads of the electronic components are in physical contact with said rotating disk and are hence subject to be damaged. Another disadvantage is that an additional pick-and-place mechanism is, required that, moreover, can cause some damage to the components, concerned.

The invention aims to overcome the aforementioned and other disadvantages.

BRIEF SUMMARY OF THE INVENTION

To this aim, the invention concerns a device for transferring electronic components from an inclined gravity supply track to another element, more particularly a receiving element, characterized in that it comprises at least one swing arm that is fixed to, or is part of, an inclined rotating shaft that is connected to driving means and that is positioned between the supply track and the receiving element, whereby the swing arm forms an angle with the rotating shaft and is at least rotatable between a first position, whereby it is situated parallel to and above the supply track, and a second position whereby the swing arm is situated above the receiving element, said device further comprising suction means to suck up and to hold a concerned component against the swing arm.

An advantage of the device according to the invention is that it allows for a very high throughput speed.

Another advantage is that no impact force from a pick-and-place arm is applied to the electronic components, eliminating all risks of damaging the components and making it hence suitable to also handle more delicate electronic components.

Yet, another advantage of the device according to the invention is that, due to the smooth controlled rotation of the swing arm, the electronic components keep their correct position on the swing arm, so that they are always correctly positioned in a pocket of the receiving element, hence avoiding costly system jams.

DESCRIPTION OF THE DRAWINGS

With the intention of better showing the characteristics of the invention, several preferred forms of embodiment are described hereafter, by means of example, without any limitative character, with reference to the accompanying drawings, wherein.

DETAILED DESCRIPTION OF PERFERRED EMBODIMENTS OF THE INVENTION

Figure 1:
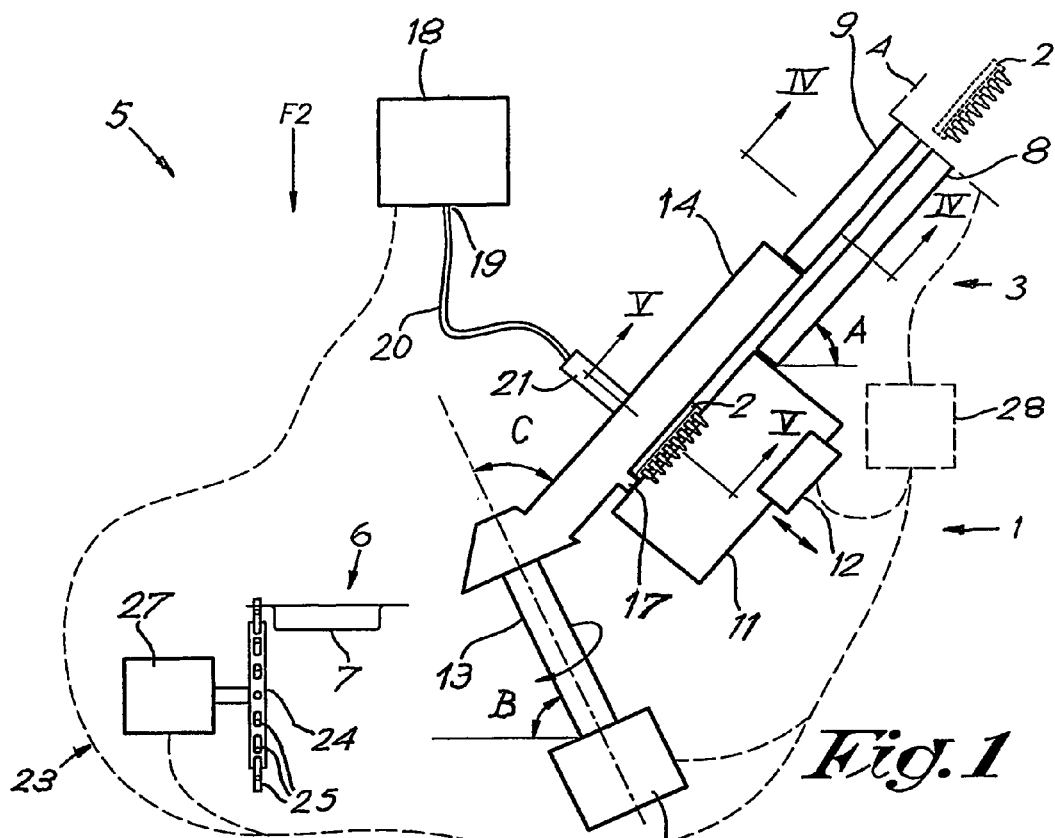
FIG. 1 schematically represents a device according to the invention.

FIGS. 1 to 5 represent a device 1 according to the invention for transferring electronic components 2 from an inclined gravity supply track 3 which receives singular electronic components 2 from an inspection and supply compartment 4 of a packaging machine 5, to a receiving element 6, which, in this case, is a horizontally positioned packing tape comprising a series of pockets 7 that are equally spaced along the longitudinal direction of the tape and which can contain individual components 2.

The gravity supply track 3 extends in a vertical plane and is positioned facing the exit where the electronic components 2 are released from the above mentioned inspection and supply compartment 4.

It comprises two parallel fixed guiding profiles, respectively 8 and 9, which are positioned at a small distance apart and one above the other, and, which are inclined with an inclination angle A that, in the example shown, is an angle of 45°, but which can also have a different value.

The upper profile 9 contains in its bottom surface a longitudinal guiding groove 10 that is centred over the top of the lower profile 8.

The supply track 3 also contains an additional guiding profile 11 with the same width as the lower profile 8 and which is parallel to it.

This additional profile 11 is connected to driving means 12 like an electromagnet or such, and is movable in the plane of the supply track 3, between a lower position and an upper position, whereby, in this upper position, the upper surfaces of this movable profile 11 is aligned with the upper surface of the fixed lower profile 8.

The device 1 according to the invention is installed between the supply track 3 and the above mentioned receiving element 6 and comprises an inclined rotation shaft 13 which is positioned in the same vertical plane as the supply track 3 and which carries a swing arm 14 which is fixed in an angle to the rotating shaft 13 and which is preferably detachable.

Figure 2:
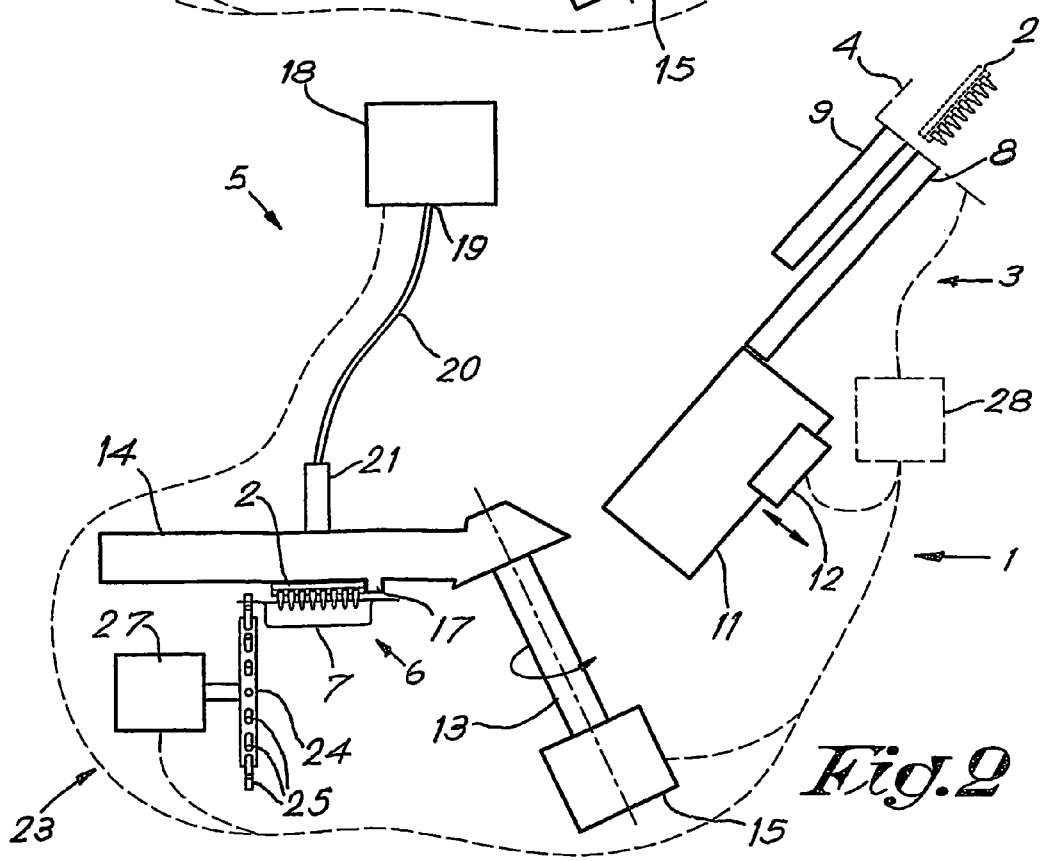
FIG. 2 represents the device of FIG. 1 in a second position.
Figure 3:
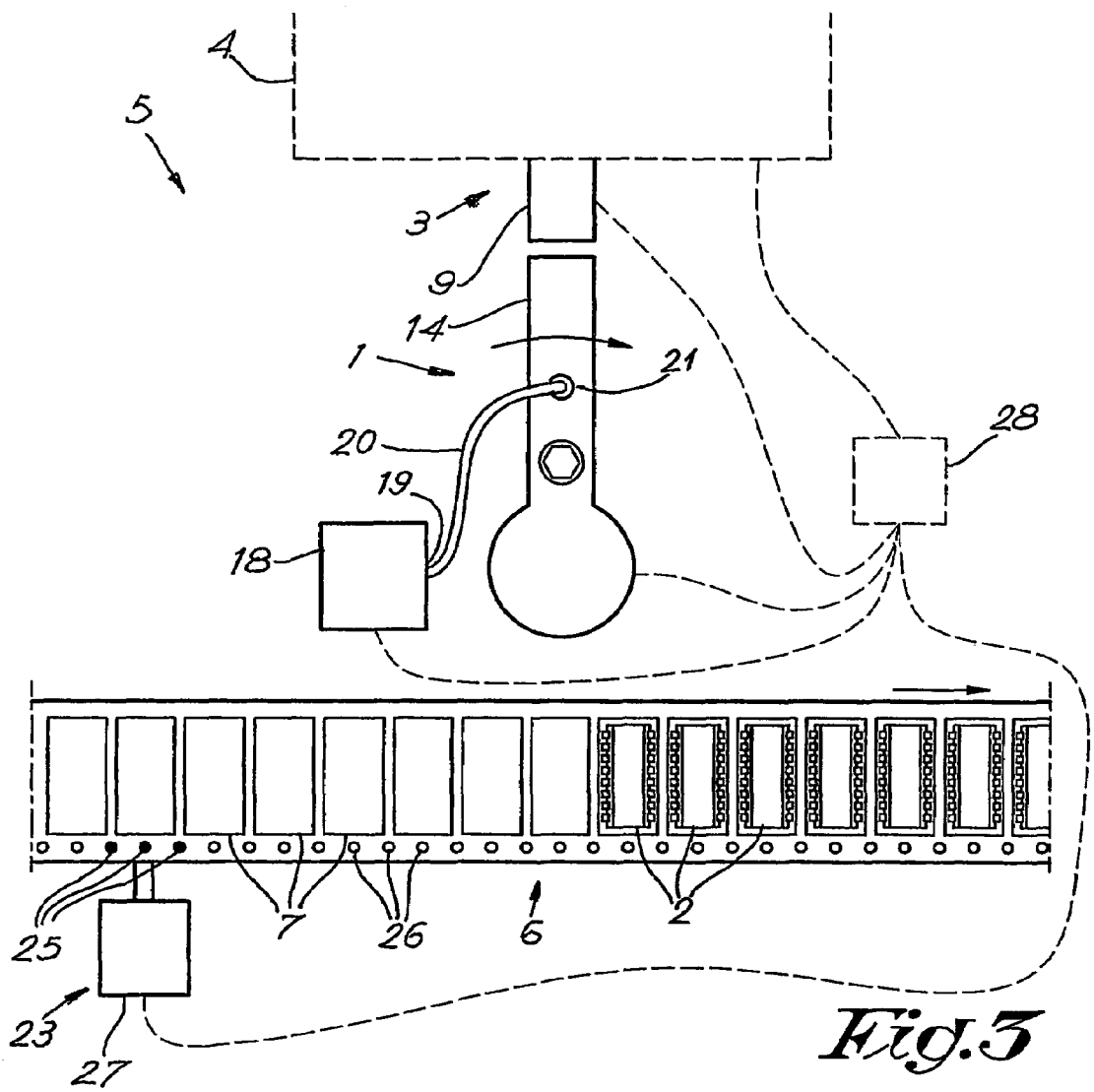
FIG. 3 represents a top view according arrow F2 in FIG. 1.
Figure 4:
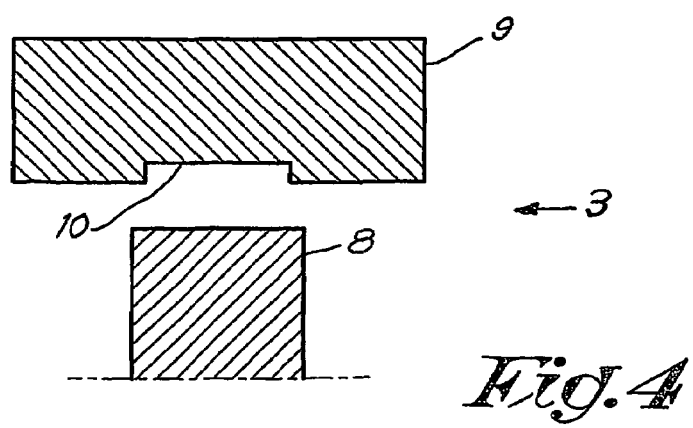
FIGS. 4 and 5 represent on a larger scale two cross-sections according to the respective lines IV—IV and V—V in FIG. 1.
Figure 5:
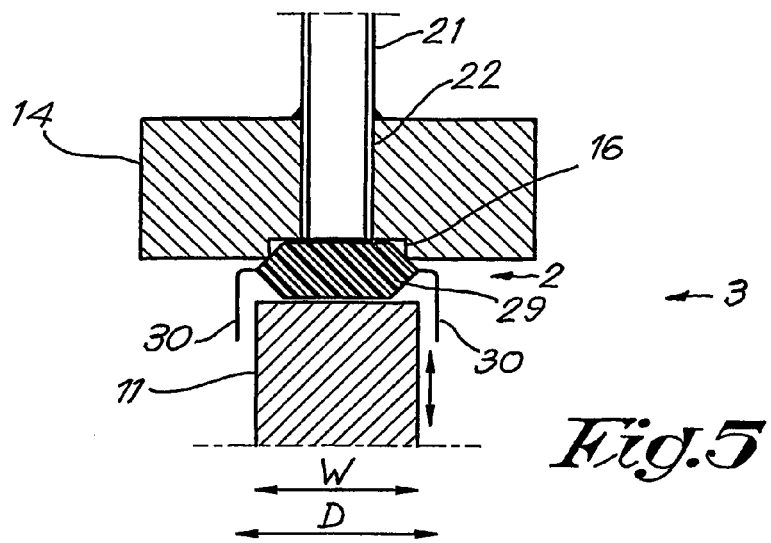

The rotating shaft 13 is connected to drive means 15, like an electrical motor or such, and is rotatable between a first position as represented in FIG. 1, whereby the swing arm 14 is situated above the supply track 3, and at least a second position as represented in FIG. 2, preferably corresponding to a rotation over 180°, whereby the swing arm 14 is situated above and across the receiving element 6.

The rotating shaft 13 and the swing arm 14 are preferably oriented in such a way that, in said first position, the swing arm 14 is parallel to the supply track 3, whilst in said second position, the swing arm 14 is mainly directed in a horizontal direction.

This is achieved by positioning the rotating shaft 13 and the swing arm 14 in such a way that the inclination angle B of the rotating shaft 13 and the acute angle C, formed between the swing arm 14 and the rotating shaft 13, are both approximately equal to the value of a right angle minus half the value of the above mentioned inclination angle A of the supply track 3. This is reflected by the expression B=C= (90°−A/2). Where A equals 45°, for example, B=67°30'.

A longitudinal guiding groove 16 for the electronic components 2 is provided in the bottom surface at the swing arm 14, whereby this groove 16 is centred over the supply track 3 when the swing arm 14 is in its first position and consequently forms in this position of the swing arm an extension for the guiding groove 10 of the fixed upper profile 9 of the supply track 3.

The guiding groove 16 in the swing arm 14 is interrupted by a stop 17 extending from the bottom surface of the swing arm 14.

The device 1 according to the invention comprises suction means formed by a vacuum device 18 that contains a suction port 19 that is connected to the guiding groove 16 of the swing arm 14 by means of a hose 20 that is connected to a tube 21 that extends through a passage hole 22 in the swing arm 14 and that communicates with said groove 16.

The above mentioned receiving element 6 is movable in its longitudinal direction by means of a traction mechanism 23 that is for instance formed by a traction wheel 24 with radial extending pins 25 that co-operate with equally spaced perforations 26 in the rim of said receiving element 6 and that is fixed to the shaft of a driving motor 27.

Control means 28 are provided to synchronise the movements of the above mentioned movable parts and are therefore connected respectively to the release mechanism of the inspection and supply compartment 4; to the driving means 12 of the movable profile 11; to the driving means 15 of the rotating shaft; to the vacuum device 18; and finally to the traction mechanism 23 of the receiving element 6. These control means 28 are well known by a person skilled in the concerned technical field and are therefore not further described in detail in the present application.

The operation of the device according to the invention is very easy and as follows.

The electronic components 2 are released one by one by the control means 28 from the inspection and supply compartment 4 and are fed between the fixed upper and lower profile 8–9 of the supply track 3.

When an electronic component 2 is released, the movable part 11 of the supply track 3 is situated in its upper position and the swing arm 14 is situated in its first position. This situation is represented in FIG. 1 and corresponds to a situation where the movable profile 11 forms an extension for the lower fixed profile 8 and where the guiding groove 10 of the swing arm 14 is aligned with the guiding groove 16 of the fixed upper profile 9 of the supply track 3.

It is clear that the released component 2 will slide down by gravity, being supported at the bottom surface of its body 29 by the guiding profiles 8–11 and being guided at its top by the guiding grooves 10–16 of the upper profile 9 and of the swing arm 14, in such a way that the leads 30 of the component 2 are freely suspended on both sides of the profiles 8–11 of the supply track 3 and are not in contact with any part of the device 1. The width W of the profiles 8–11 is therefore smaller than the distance D between opposite leads 30 of the component 2.

When the component 2 reaches the above mentioned stop 17, the vacuum device 18 is activated by the control means 28 so that the component 2 is sucked up in the guiding groove 16 and is strongly held against the swing arm 14.

Once the vacuum device 18 is activated, the movable part 11 of the supply track 3 is moved to the lower position at a safe distance from the leads 30 of the component 2, so that, during a next step, when the component 2 is transferred by rotation of the swing arm 14, the leads 30 are kept clear of the supply track 3 to avoid possible damage to the leads.

The swing arm 14 is next rotated to its second position, as represented in FIG. 2, so that the electronic component 2 is transferred to a position exactly above a pocket 7 of the receiving element 6.

The vacuum device 18 is then deactivated by the control means 28, so that the electronic component 2 is released and is dropped into said pocket 7 from a very small height.

Next, the traction mechanism 23 is activated and the receiving element 6 is moved over a distance corresponding to the centre distance between two successive pockets 7 and the newly filled pocket 7 is simultaneously sealed off by a tape which is not represented in the drawings.

At the same time, the swing arm 14 is rotated back to its first position and the movable part 11 of the supply track 3 is raised again to align with the lower profile, so that the situation, as represented in FIG. 1, is again obtained.

Next, a following component 2 is released from the supply compartment 4 to be transferred to the receiving element 6 in a similar way as already explained.

Preferably the empty receiving element 6, more specifically the packing tape, is unwound from a first reel which is not represented in the drawings, whilst the filled and sealed packing tape is wound on a second reel which is also not represented in the drawings.

Figure 6:
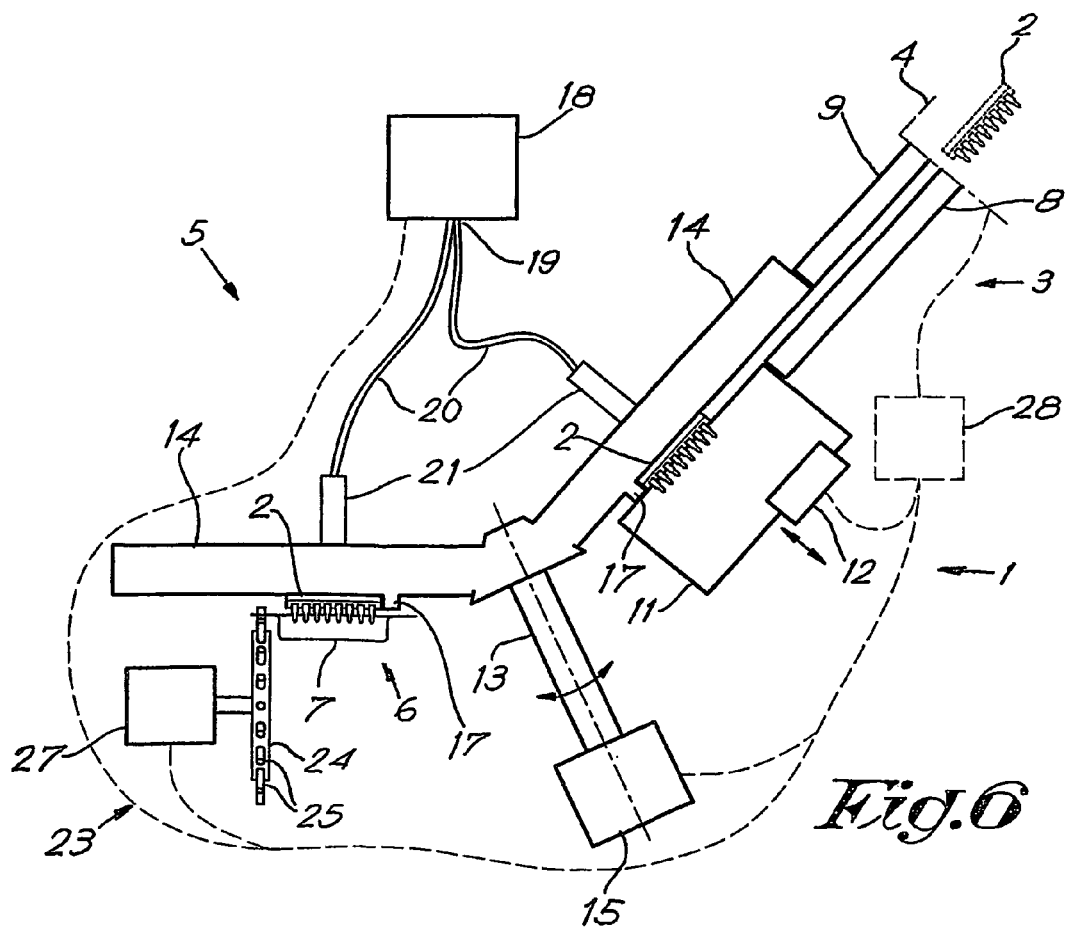
FIG. 6 schematically represents a variant of the device of FIG. 1.

Another embodiment of a device according the invention is represented in FIG. 6, whereby a second swing arm 14 is fixed to the rotating shaft 13 in a symmetrical way with respect to the first swing arm 14 and whereby this second swing arm 14 is also connected to the vacuum device 18.

It is clear that in this case, for the same speed of the rotating shaft 13, the speed of transferring electronic components 2 is doubled because a component 2 can be picked up by one swing arm 14 at the same time as a previously picked component 2 is released over a pocket 7 of the receiving element 6 by the other swing arm 14.

In yet another embodiment three swing arms 14 are fixed to the rotating shaft 13 under three identical angles (i.e., 120° apart instead of 180° apart as seen in FIG. 6).

Figure 7:
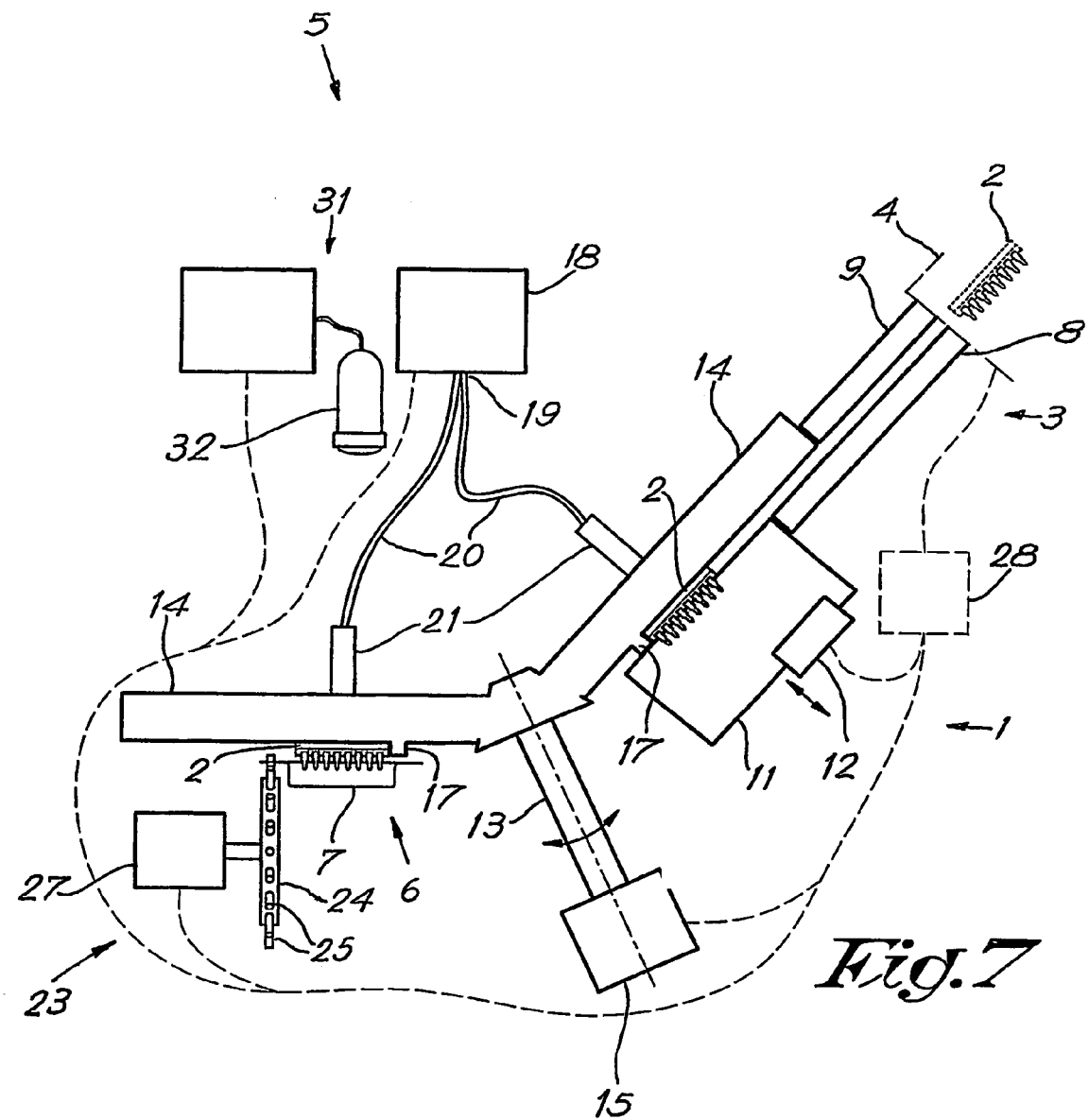
FIG. 7 schematically represents the device of FIG. 6, but with additional visual inspection means.

In FIG. 7 yet another embodiment of the invention is represented, whereby, in respect to the previous embodiment, a visual detection device 31 with a detection camera 32 or the like has been added, which camera 32 is positioned right on top of the pocket 7 which has to be filled next.

The visual detection device 31 is connected to the control means 28 to monitor the movement of the receiving element 6 in such a way that the consecutive pockets 7 of the receiving element 6 are always stopped at exactly the same centred position right underneath the swing arm 14 when it releases a component 2, compensating in this way for possible tolerance differences in spacing and dimensions of the pockets 7.

The visual detection device 31 also monitors the correct positioning of the electronic components 2 in the pockets 7 and the packaging process is stopped as soon as a positioning problem is detected, so that an operator is able to remove the misplaced component 2 before the pocket 7 is sealed off.

An important advantage of the present invention is that the detection camera 32 can be placed above the pocket 7 which has to be filled next. This is not possible for existing packaging machines where the pick-and-place device is already on top of this spot, so that usually the detection camera is installed in a more downstream position where incorrectly positioned components 2 can only be detected after they have been sealed in. Also, in this case, monitoring of the correct positioning of the concerned pocket 7 to be filled is not very accurate because monitoring is done on another downstream pocket 7.

The present invention is in no way limited to the forms of embodiment described by way of example and represented in the figures, however, on the contrary, such device for transferring electronic components may be realized in various forms and dimensions without leaving the scope of the invention.

The invention claimed is:

1. Device for transferring electronic components from an inclined gravity supply track to another element, comprising at least one swing arm fixed to an inclined rotating shaft that is connected to a driving device and that is positioned between the supply track and the other element, wherein the swing arm forms an acute angle with the rotating shaft and is at least rotatable between a first position, where it is situated so as to extend parallel to and above the supply track, and a second position where the swing arm is situated to extend above the other element, said swing arm cooperating with a suction device arranged to engage a respective component and to hold said component against the swing arm for motion therewith.

2. Device according to claim 1, wherein the inclination angle of the rotating shaft and the acute angle formed between the swing arm and the rotating shaft are both approximately equal to the value of a right angle minus one-half the value of the inclination angle of the supply track.

3. Device according to claim 2, wherein the inclination angle of the supply track is 45° and the inclination angle of the rotating shaft and the angle formed between the swing arm and the rotating shaft are both equal to 67°30′.

4. Device according to claim 1, wherein the inclined supply track contains at least one guiding profile arranged to support a respective electronic component on the bottom surface of its body.

5. Device according to claim 4, wherein the electronic components have opposed leads, and said guiding profiles have a width that enables support of a respective electronic component that is smaller than the distance between opposite leads of the electronic components to be transferred.

6. Device according to claim 4, wherein at least a part of said supply track is movable.

7. Device according to claim 1, wherein the swing arm includes in its bottom surface a longitudinal guiding groove for the electronic components, wherein this guiding groove is centered above the supply track when the swing arm is situated in said first position.

8. Device according to claim 7, wherein the guiding groove in the swing arm is interrupted by a stop.

9. Device according to claim 7, wherein said suction device comprises at least a vacuum device which is connected to the guiding groove in the swing arm adjacent said stop.

10. Device according to claim 1, comprising two similar ones of said at least one swing arm which are symmetrically fixed to the rotating shaft.

11. Device according to claim 1, comprising three similar ones of said at least one swing arm which are fixed to the rotating shaft at three identical angles.

12. Device according to claim 9, wherein the electronic components are supplied one by one by a release mechanism; the other element is a receiving element that is a packing tape that is moved by a traction mechanism; and further comprising a control system that is connected to said release mechanism, to the driving means of the supply track, to the driving means of the rotating shaft, to the vacuum device, and to the traction mechanism associated with the receiving element.

13. Device according to claim 12, wherein said control system additionally includes a visual detection device with a camera which is positioned above the receiving element at a position above the corresponding second position of the swing arms.

* * * * *